(12) United States Patent
Yue et al.

(10) Patent No.: US 7,783,951 B2
(45) Date of Patent: Aug. 24, 2010

(54) MULTIPLEXED CODING FOR USER COOPERATION

(75) Inventors: Guosen Yue, Plainsboro, NJ (US); Xiadong Wang, New York, NY (US); Mohammad Madihian, Plainsboro, NJ (US)

(73) Assignee: NEC Laboratories, America, Inc., Princeton, NJ (US)

( * ) Notice: Subject to any disclaimer, the term of this patent is extended or adjusted under 35 U.S.C. 154(b) by 897 days.

(21) Appl. No.: 11/621,743

(22) Filed: Jan. 10, 2007

(65) Prior Publication Data

US 2007/0186136 A1    Aug. 9, 2007

Related U.S. Application Data

(60) Provisional application No. 60/743,265, filed on Feb. 9, 2006.

(51) Int. Cl.
*H03M 13/00* (2006.01)

(52) U.S. Cl. ...................... 714/752; 714/758

(58) Field of Classification Search .............. 714/752, 714/758
See application file for complete search history.

(56) References Cited

U.S. PATENT DOCUMENTS 7,530,002 B2 *   5/2009   Lee et al. ................ 714/758

\* cited by examiner

*Primary Examiner*—Sam Rizk
(74) *Attorney, Agent, or Firm*—James Bitetto; Joseph Koladka (57) ABSTRACT

A method and system for decoding a combination of a first message and a second message that were encoded using a generating matrix of a systematic linear block code is described. The combination of the first message and the second message may be decoded using a parity check matrix. If the second message is known, the first message is decoding using a first component code parity check matrix. If first message is known, the second message is decoded using a second component code parity check matrix. The parity check matrix can be derived from the generating matrix and the first message or the second message can be decoded using the first or second component code parity check matrix.

14 Claims, 5 Drawing Sheets

MULTIPLEXED CODING FOR USER COOPERATION

This application claims the benefit of U.S. Provisional Application No. 60/743,265 filed Feb. 9, 2006, which is incorporated herein by reference.

BACKGROUND OF THE INVENTION

The present invention relates generally to wireless communications, and more particularly to multiplexed coding design for cooperative communications.

In wireless communications, a transmitter typically transmits information to a receiver over a communication channel. Statistically, a communication channel can be defined as a triple consisting of an input alphabet, an output alphabet, and for each pair (i,o) of input and output elements of each alphabet, a transition probability p(i,o). The transition probability is the probability that the receiver receives the symbol o given that the transmitter transmitted symbol i over the channel.

Given a communication channel, there exists a number, called the capacity of the channel, such that reliable transmission is possible for rates arbitrarily close to the capacity, and reliable transmission is not possible for rates above the capacity In some circumstances, the distance separating the transmitter (i.e., source) and the receiver (i.e., destination) is large. Alternatively or additionally, the communication channel over which the source and destination communicate may be of poor quality. As a result, interference may be introduced in the communications between the source and the destination, which can result in distortion of the message. To reduce the effect of interference, the transmitter and receiver often transmit information over a communication channel using a coding scheme. The coding scheme provides redundancy so that the message can be detected (and decoded) by the receiver in the presence of interference.

The coding scheme uses codes, which are an ensemble (i.e., group) of vectors that are to be transmitted by the transmitter. The length of the vectors are assumed to be the same and is referred to as the block length of the code. If the number of vectors is $K=2^k$, then every vector can be described with k bits.

Figure 1:
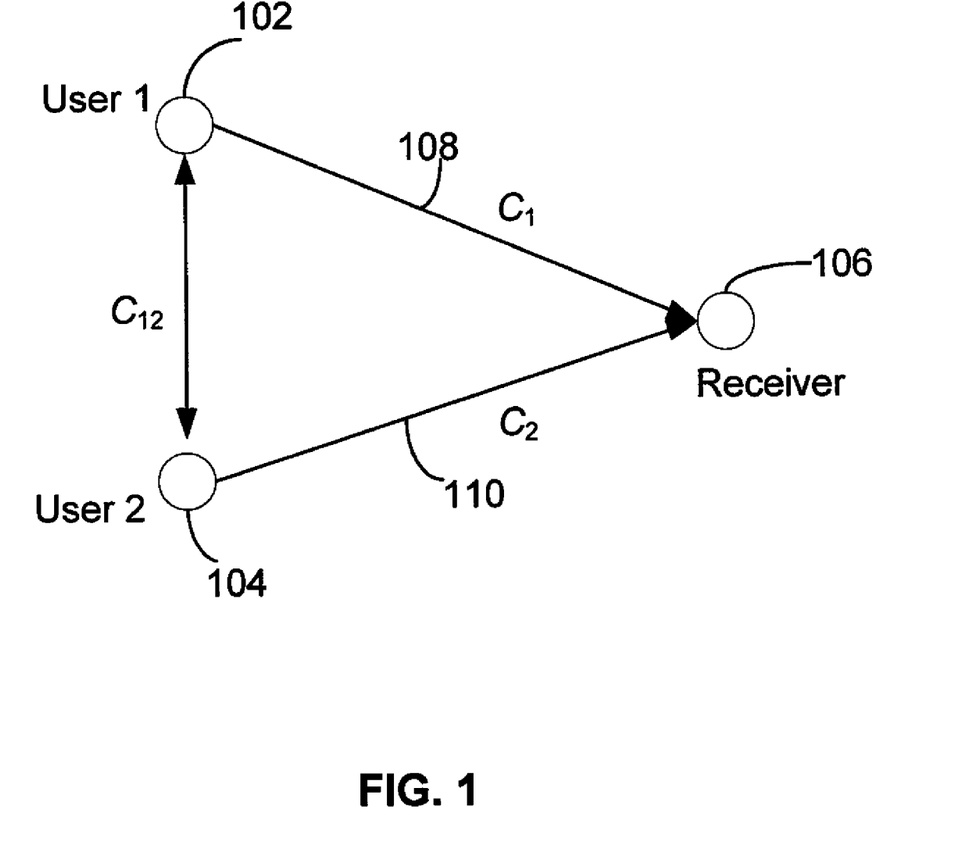
FIG. 1 shows a diagram of a two-user cooperative system.

Employing multiple antennas in a mobile terminal to achieve transmit diversity or special diversity, known as multiple-input and multiple-output (MIMO), has become a promising solution to combat fading channels and potentially provide very high data rates. Recently, cooperative communication has drawn increasing interest in the wireless communication area due to user cooperation diversity or cooperative diversity gain, which is another form of spatial diversity created by using a collection of distributed antennas from multiple terminals in a network. User cooperation is a framework where two users can jointly transmit their signals, in coded cooperation, using both of their antennas. As shown in FIG. 1, with user cooperation, each user's transmission is receivable, to different degrees, by the other user as well as the receiver 106. Therefore, a user receives and re-transmits the data of another user to the receiver 106, thus providing assistance to the other user. Because the two messages are received via independent paths 108 and 110, the spatial diversity will provide an improvement in overall reception. As shown in FIG. 1, with user cooperation, a first user 102 and a second user 104 share their antennas to form a virtual antenna array providing the potential of realizing spatial diversity through distributed transmission and signal processing.

Two coding design methods, multiplexed coding and superposition coding, theoretically perform very well. However, practically, it is difficult to build or decode as well as theoretically described when implementing these coding schemes. These two schemes are very difficult to implement with practical codes.

Therefore, there remains a need to design a coding method which is easier to implement, but approaches the accuracy and rate of multiplexed coding.

SUMMARY OF THE INVENTION

In accordance with an embodiment of the invention a method for decoding a combination of a first message and a second message that were encoded using a generating matrix of a systematic linear block code is provided. In one embodiment, the combination of the first message and the second message is decoded using a parity check matrix.

In another embodiment where the second message is known, the first message is decoded using a first component code parity check matrix.

In another embodiment where the first message is known, the second message is decoded using a second component code parity check matrix.

The parity check matrix can be derived from the generating matrix and the first message or the second message can be decoded using the first or second component code parity check matrix.

The multiplexed component codes may be derived for a generating matrix by generating a generator matrix for a multiplexed code, and obtaining component codes from the generator matrices and the corresponding parity check matrices.

These and other advantages of the invention will be apparent to those of ordinary skill in the art by reference to the following detailed description and the accompanying drawings.

DETAILED DESCRIPTION

Figure 2:
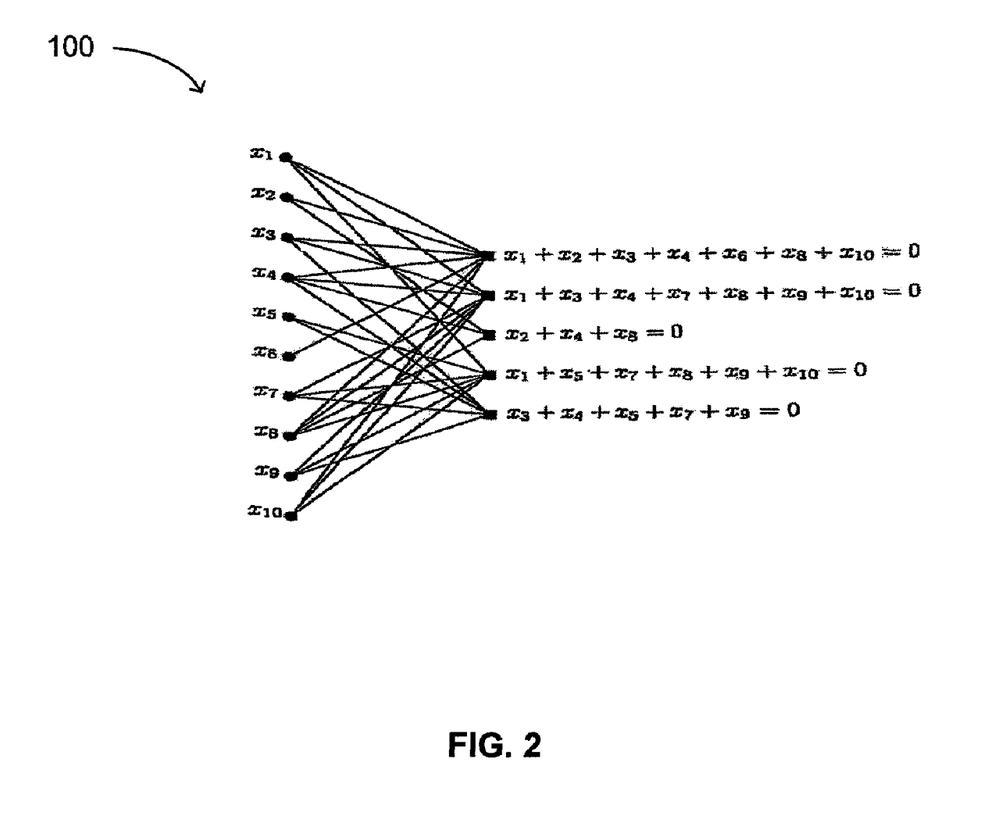
FIG. 2 shows a graph of a low-density parity check (LDPC) code.

Low-density parity check (LDPC) codes are a class of linear block codes that often approach the capacity of conventional single user communication channels. The name comes from the characteristic of their parity-check matrix, which contains only a few 1's in comparison to the amount of 0's. LDPC codes may use linear time complex algorithms for decoding In more detail, LDPC codes are linear codes obtained from sparse bipartite graphs. FIG. 2 shows a graph 100 of an LDPC code. The graph 100 has n left nodes (i.e., $x_1$ to $x_{10}$) (called message nodes) and m right nodes (called check nodes). The graph 100 gives rise to a linear code of block length n and dimension at least n−m in the following way: the m coordinates of the codewords are associated with the n message nodes. The codewords are those vectors $(c_1, \ldots, c_n)$ such that, for all check nodes, the sum of the neighboring positions among the message nodes is zero.

Thus, a binary LDPC code is a linear block code with a sparse binary parity-check matrix. This m×n parity check matrix can be represented by a bipartite graph (e.g., as shown in FIG. 2) with n variable nodes corresponding to columns (bits in the codeword) and m check nodes corresponding to rows (parity check equations). A one in a certain row and column of the parity check matrix denotes an edge between the respective check and variable node in the graph, whereas a zero indicates the absence of an edge.

An LDPC code ensemble is characterized by its variable and check degree distributions (or profiles) $\lambda = \lfloor \lambda_2 \ldots \lambda_{d_v} \rfloor$ and $\rho = \lfloor \rho_2 \ldots \rho_{d_c} \rfloor$, respectively, where $\lambda_i(\rho_i)$ denotes the fraction of edges connected to a variable (check) node of degree i, and $d_v(d_c)$ is the maximum number of edges connected to any variable (check) node. An equivalent representation of LDPC code profiles can use generating functions $$\lambda(x) = \sum_{i=2}^{d_v} \lambda_i x^{i-1},$$

$$\rho(x) = \sum_{i=2}^{d_c} \rho_i x^{i-1}.$$

The design rate of an ensemble can be given in terms of $\lambda(x)$ and $\rho(x)$ by $$R = 1 - \frac{m}{n} = 1 - \frac{\int_0^1 \rho(x) dx}{\int_0^1 \lambda(x) dx}$$

In a two-user cooperative coding system, as shown in FIG. 1 each user either encodes its own message or encodes a message for the other user into a multiplexed code. Therefore, each user needs two codebooks. The joint codebooks are called multiplexed code. If the receiver needs to decode one message by knowing the other it uses a subset of the multiplexed code called component codes.

It is very difficult to build a fully multiplexed code that is able to decode two messages at or near the theoretical capacity rate. To build such a capacity-approaching fully multiplexed code, a code must be designed so that both the multiplexed codebook and the codebook subsets or component codes approach performance capacity. Although it might be possible in theory to do this, it is very difficult to implement practically. LDPC codes, one class of random-like capacity-approaching linear block codes, may be used to build a fully multiplexed code. For example, the fully multiplexed code can be built in the following way $$x = uG = [u_1 u_2] \begin{bmatrix} G_1 \\ G_2 \end{bmatrix}$$

where G is the generator matrix for multiplexed code, $G_1$ and $G_2$ are the generator matrices of the component codes for message $u_1$ and $u_2$, respectively, and $$G = [G_1^T G_2^T]^T, u = [u_1 u_2].$$

To design multiplexed code that approaches full capacity, its parity check matrix H is designed so that the multiplexed code (with the generator matrix G) is $(n, n(R_1+R_2))$, and also each $H_i$ (corresponding to $G_i$) is $(n, nR_i)$. This is very difficult to achieve practically.

Since it is difficult to practically implement a fully multiplexed code, the fully multiplexed code may be approximated. This approximation code is called a "partially multiplexed code".

The partially multiplexed code is formed from a binary systematic code. In a binary systematic (n, k) code, $k=k_1+k_2=n(R_1+R_2)$, with the parity check matrix given by $$H = [P_{(n-k)\times k} I_{n-k}] = [P_1 P_2 I],$$

where $P=[P_1 P_2]$ with the dimensions of $P_1$ and $P_2$ given by $(n-k)\times k_1$ and $(n-k)\times k_2$, respectively. The generator matrix is then given by $$G = [I_k \quad P^T] = \begin{bmatrix} I_{k_1} & 0 & P_1^T \\ 0 & I_{k_2} & P_2^T \end{bmatrix}$$

G is used to construct the component codes in the following manner. Then two component codes are constructed by separating the parity check matrix $P=[P_1, P_2]$. After the separation, the submatrices $I_{k_1}$, $P_1^T$ is taken from G to form the component code $G_1$, and the submatrices $I_{k_2}$, $P_2^T$ is taken from G to form the component code $G_2$. The corresponding parity check matrices then become $H_1=[P_1 I_{n-k}]$, $H_2=[P_2 I_{n-k}]$, respectively. Therefore, this construction is a method to build a multiplex code from G, a $(n-k_2, k_1)$ code with the generator $$G_1 = [I_{k_1} P_1^T]$$

and a $(n-k_1, k_2)$ code with the generator $$G_2 = [I_{k_2} P_2^T]$$

The parity check matrices are then given by $$H_1 = [P_1 I_{n-k}], H_2 = [P_2 I_{n-k}]$$

With this coding method of partially multiplexed coding, a message of length $k=k_1+k_2$ (which can be treated as a concatenation of two messages with lengths $k_1$ and $k_2$) can be decoded the with the parity check matrix H at the full rate $$\frac{k}{n} = \frac{k_1 + k_2}{n} = R_1 + R_2$$

Once one message is known, the receiver is then able to decode the message $u_1$ of length $k_1$ at a rate of $k_1=(n-k_2)$, or decode message $u_2$ at a rate $k_2=(n-k_1)$. Because $$\frac{k_1}{n - k_2} > \frac{k_1}{n} = R_1,$$

and $$\frac{k_2}{n - k_1} > \frac{k_2}{n} = R_2$$

the rate of decoding the component codes cannot achieve the rate of the component codes in the fully multiplexed codes.

Figure 3:
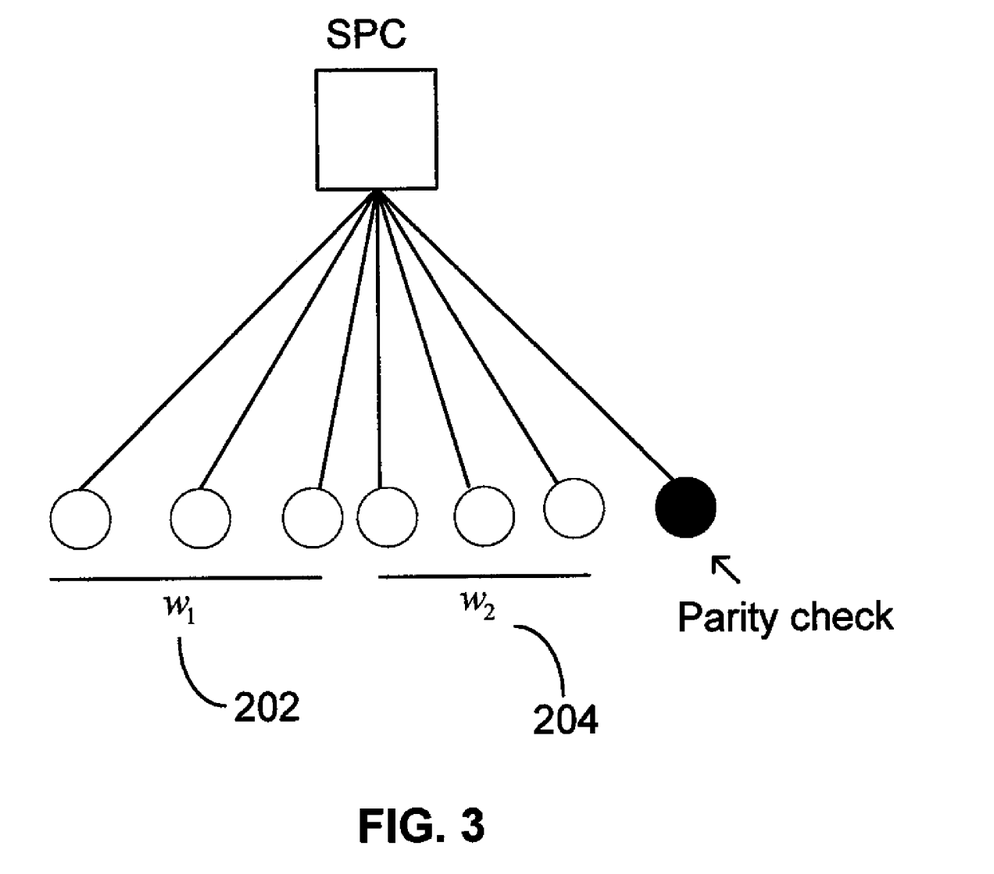
FIG. 3 shows a Tanner graph representation of a single parity check code for multiplexing.

For example, an illustrative case is the single parity check (SPC) code, shown in FIG. 3. When two nodes cooperate, each node encodes its own information and the sequence from the other node by a SPC. If the receiver knows one sequence $w_1$, 202 it then decodes a SPC code to obtain the other sequence $w_2$, 204 as shown in FIG. 3.

So in a cooperative system as shown in FIG. 1, the rate of total multiplexed code for both messages is $2R=6/7$. The effective rate for the component code is $R_{1,2}=3/4$ when one message is known. However, this does not restrict the code rate for the non-cooperation case, since each user in the cooperative system has two codebooks. Each user can use other codebook to encode and transmit its own message when the channel between users does not support cooperation. For instance, in this example, the user can encode its own message by a rate-$3/7$ (7, 3) linear block code.

There is a performance loss for partial multiplexed code since the effective rate of the component code for multiplexed code is larger than that in the fully multiplexed code. However, when $R_1+R_2$ is not high, the performance loss will be small. Assuming $R_1=R_2=R$, the total rate for the multiplexed code is $2R$. For fully multiplexed codes, the rate for the component code is R. The effective rate of the component code in the partially multiplexed code is then given by $$R_{1,2} = \frac{k/2}{n-k/2} = \frac{R}{1-R}$$

A better performing partially multiplexed code may be built using a systematic Irregular Repeat Accumulate (IRA) code. An IRA code can be defined by a (n−k)×n parity-check matrix with the form $H=[P_A, P_B]$, where $P_A$ is a sparse (n−k)×k matrix and $P_B$ is a (n−k)×(n−k) matrix given below $$P_B = \begin{bmatrix} 1 & & & & & \\ 1 & 1 & & & & \\ & 1 & 1 & & & \\ & & & \ddots & & \\ & & & & 1 & 1 \\ & & & & & 1 & 1 \end{bmatrix}$$

and $$P_B^{-1} = \begin{bmatrix} 1 & & & \\ 1 & 1 & & \\ \vdots & & \ddots & \\ 1 & \cdots & & 1 \end{bmatrix},$$

where $P_B^{-1}$ is the binary inverse of $P_B$ and can be realized by a differential encoder. Furthermore, the generator matrix is given by $G=[I, P_A^T(P_B^{-1})^T]$, where I is a k×k identity matrix and $^T$ denotes a matrix transpose.

The multiplexed IRA code is built starting with the multiplexed code $H_{mp}$ given by $H_{mp}=[P_A; P_B]$; where $H_{mp}$: m−n; $m=n-k_1-k_2$; $P_A$: m×(k_1+k_2); $P_B$: m×m.

Then the generator matrix of the multiplexed code is written as $$G_{mp} = [I_{(k_1+k_2)\times(k_1+k_2)}, P_Z^T(P_B^{-1})^T]$$

Then, $P_A$ is separated into two parts, i.e., $P_A=[P_{A;1}; P_{A;2}]$, where $P_{A;1}$: m×k_1; $P_{A;2}$: m×k_2. Then $$P_A^T = \begin{bmatrix} P_{A,1}^T \\ P_{A,2}^T \end{bmatrix},$$

and $$G_{mp} = \begin{bmatrix} I_{k_1} & 0 & P_{A,1}^T(P_B^{-1})^T \\ 0 & I_{k_2} & P_{A,2}^T(P_B^{-1})^T \end{bmatrix}$$

The component codes may be obtained with the generator matrices given by $$G_1 = [I_{k_1}, P_{A,1}^T(p_B^{-1})^T]$$
$$G_2 = [I_{k_2}, P_{A,2}^T(P_B^{-1})^T]$$

with the corresponding parity check matrices given by $$H_1 = [P_{A,1}, P_B],$$
$$H_2 = [P_{A,2}, P_B],$$

Since $P_A$ is sparse, the matrices $P_{A;1}$ and $P_{A;2}$ split from $P_A$ are also sparse, so are the component code matrices $H_1$ and $H_2$. Therefore, the sum-product iterative decoding can be employed for the component codes so that low decoding complexity is achieved. The resulting parity matrices also represent the systematic IRA codes. Therefore, the low complexity encoding for the component codes is also achieved. Since submatrices $P_{A;1}$ and $P_{A;2}$ in $H_1$ and $H_2$ are split from $P_A$, $P_{A;1}$ and $P_{A;2}$ share the similar degree distribution with $P_A$.

Figure 4:
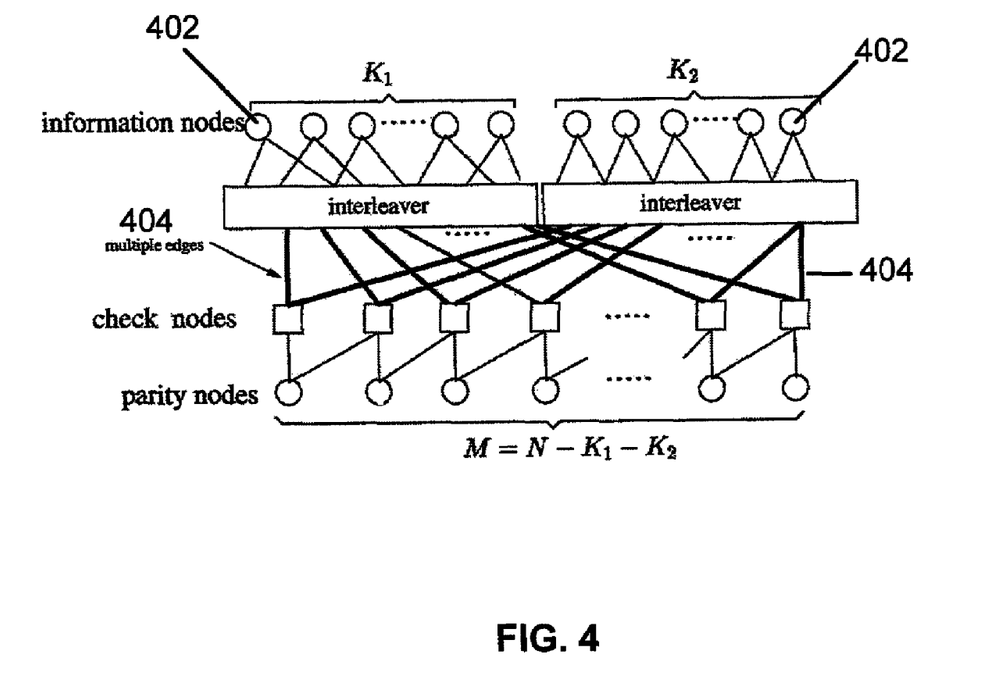
FIG. 4 shows a Tanner graph representation of partially multiplexed coding built by irregular repeat accumulate codes.

FIG. 4 is a Tanner graph representation the partially multiplexed coding built by IRA codes. The top information nodes 402 and the edges 404 connected to the information nodes 402 are separated into two parts $K_1$ and $K_2$. By removing all the $K_2$ nodes 402 and edges 404, the code graph is obtained. This code graph is also an IRA code, for the component code 1. The code graph for component code 2 can be obtained by the same method.

Figure 5:
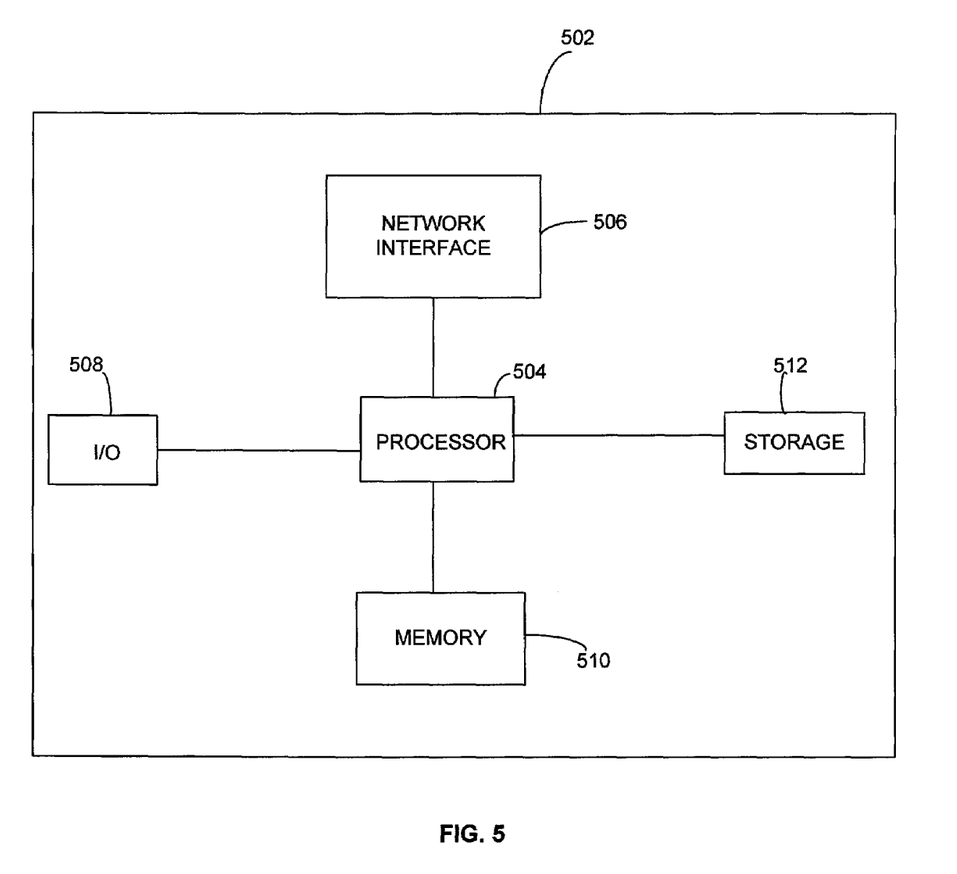
FIG. 5 shows a high level block diagram of a computer system which may be used in an embodiment of the invention.

Computers executing coding systems are well known in the art, and may be implemented, for example, using well-known computer processors, memory units, storage devices, computer software, and other components. A high-level block diagram of such a computer is shown in FIG. 5. Computer 502 contains a processor 504 which controls the overall operation of computer 502 by executing computer program instructions which define such operation.

The computer program instructions may be stored in a storage device 512 (e.g., magnetic disk) and loaded into memory 510 when execution of the computer program instructions is desired. Thus, the email client application will be defined by computer program instructions stored in memory 510 and/or storage 512 and the email client application will be controlled by processor 504 executing the computer program instructions. Computer 502 also includes one or more network interfaces 506 for communicating with other devices via a network. Computer 502 also includes input/output 508 which represents devices which allow for user interaction with the computer 502 (e.g., display, keyboard, mouse, speakers, buttons, etc.).

One skilled in the art will recognize that an implementation of an actual computer will contain other elements as well, and that FIG. 5 is a high level representation of some of the elements of such a computer for illustrative purposes. In addition, one skilled in the art will recognize that the processing steps described herein may also be implemented using dedicated hardware, the circuitry of which is configured specifically for implementing such processing steps. Alternatively, the processing steps may be implemented using various combinations of hardware and software. Also, the processing steps may take place in a computer or may be part of a larger machine.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for constructing component codes of a partially multiplexed code from a binary systematic (n, k) code, where $k=k1+k2=n(R1+R2)$, with a parity check matrix given by $H=[P_{(n-k)\times k} \ I_{n-k}]=[P_1P_2I]$, where $P=[P1P2]$ with dimensions of P1 and P2 given by $(n-k)\times k1$ and $(n-k)\times k2$, respectively, and a generator matrix is then given by $$G = [I_k \ P^T] = \begin{bmatrix} I_{k_1} & 0 & P_1^T \\ 0 & I_{k_2} & P_2^T \end{bmatrix}$$

comprising the steps of:
separating the parity check matrix $P=[P_1, P_2]$; stored on memory media of a memory storage apparatus;
forming the component code $G_1=[I_{k_1}P_1^T]$ using submatrices $I_{k_1}, P_1^T$ from GU;
forming the component code $G_2=[I_{k_2}P_2^T]$ using submatrices $I_{k_2}, P_2^T$ from G; and
deriving parity check matrices of $H_1=[P_1I_{n-k}]$, $H_2=[P_2I_{n-k}]$.

2. A method to build a multiplex code from G where $$G = [I_k \ P^T] = \begin{bmatrix} I_{k_1} & 0 & P_1^T \\ 0 & I_{k_2} & P_2^T \end{bmatrix},$$

a (n–k2, k1) code with the generator $G_1=[I_{k_1}P_1^T]$ and a (n–k1, k2) code with the generator $G_2=[I_{k_2} \ P_2^T]$ comprising the step of:
deriving component code parity check matrices stored on memory media of a memory storage apparatus and given by the formula $H_1=[P_1I_{n-k}]$, $H_2=[P_2I_{n-k}]$.

3. A method for decoding a combination of a first message and a second message that were encoded using a generating matrix $$G = [I_k \ P^T] = \begin{bmatrix} I_{k_1} & 0 & P_1^T \\ 0 & I_{k_2} & P_2^T \end{bmatrix}$$

of a systematic linear block code comprising the step of:
decoding the combination of the first message and the second message using a parity check matrix $H=[P_{(n-k)\times k} \ I_{n-k}]=[P_1P_2I]$ stored on memory media of a memory storage apparatus.

4. A method for decoding one of a first or a second message when the other message is known and wherein both the first message and the second message were encoded using a generating matrix $$G = [I_k \ P^T] = \begin{bmatrix} I_{k_1} & 0 & P_1^T \\ 0 & I_{k_2} & P_2^T \end{bmatrix}$$

of a systematic linear block code comprising the step of:
decoding said one of a first message or a second messages using a component code parity check matrix stored on memory media of a memory storage apparatus.

5. The method of claim 4 wherein the second message is known and the step of decoding comprises:
decoding the first message using a component code parity check matrix $H_1=[P_1 \ I_{n-k}]$.

6. The method of claim 4 wherein the first message is known and the step of decoding comprises:
decoding the second message using a component code parity check matrix $H_2=[P_2 \ I_{n-k}]$.

7. The method of claim 4 wherein the second message is known, and further comprising the steps:
deriving component code parity check matrix $H_1=[P_1 \ I_{n-k}]$ from the generating matrix; and
decoding the first message using the component code parity check matrix.

8. The method of claim 4 wherein the first message is known, and further comprising the steps of:
deriving component code parity check matrix $H_2=[P_2 \ I_{n-k}]$ from the generating matrix; and decoding the second message using the component code parity check matrix.

9. A method for generating multiplexed component codes for a generating matrix $G=[I,P_A^T(P_B^{-1})^T]$, comprising:
generating a generator matrix for a multiplexed code $G_{mp}=[I_{(k_1+k_2)\times(k_1+k_2)},P_Z^T(P_B^{-1})^T]$ stored on memory media of a memory storage apparatus;
separating PA into two parts stored on the memory media where $PA=[P_{A;1}; P_{A;2}]$, and PA;1: m×k1; PA;2: m×k2 so that $$P_A^T = \begin{bmatrix} P_{A,1}^T \\ P_{A,2}^T \end{bmatrix}, \text{ and } G_{mp} = \begin{bmatrix} I_{k_1} & 0 & P_{A,1}^T(P_B^{-1})^T \\ 0 & I_{k_2} & P_{A,2}^T(P_B^{-1})^T \end{bmatrix};$$

obtaining component codes with the generator matrices given by $$G_1 = [I_{k_1}, \quad P_{A,1}^T(p_B^{-1})^T]$$
$$G_2 = [I_{k_2}, \quad P_{A,2}^T(P_B^{-1})^T]$$

with the corresponding parity check matrices given by $$H_1 = \lfloor P_{A,1}, \quad P_B \rfloor$$
$$H_2 = [P_{A,2}, \quad P_B]$$

10. A system for decoding one of a first or a second message when the other message is known and wherein both the first message and the second message were encoded by using a generating matrix $$G = [I_k \quad P^T] = \begin{bmatrix} I_{k_1} & 0 & P_1^T \\ 0 & I_{k_2} & P_2^T \end{bmatrix}$$

of a systematic linear block code comprising the step of:
means for decoding said one of a first message or a second message using a component code parity check matrix stored on memory media of a memory storage apparatus.

11. The system of claim 10 wherein the second message is known and the step of decoding comprises:
means for decoding the first message using a component code parity check matrix $H_1=[P_1 \ I_{n-k}]$.

12. The system of claim 10 wherein the first message is known and the step of decoding comprises:
means for decoding the second message using a component code parity check matrix $H_2=[P_2 \ I_{n-k}]$.

13. The system of claim 10 wherein the second message is known, and further comprising:
means for deriving component code parity check matrix $H_1=[P_1 \ I_{n-k}]$ from the generating matrix; and
means for decoding the first message using the component code parity check matrix.

14. The system of claim 12 wherein the first message is known; and further comprising:
means for deriving component code parity check matrix $H_2=[P_2 \ I_{n-k}]$ from the generating matrix; and
means for decoding the second message using the component code parity check matrix.

* * * * *